United States Patent
Martens et al.

(10) Patent No.: US 9,103,873 B1
(45) Date of Patent: Aug. 11, 2015

(54) SYSTEMS AND METHODS FOR IMPROVED POWER CONTROL IN MILLIMETER WAVE TRANSCEIVERS

(71) Applicant: ANRITSU COMPANY, Morgan Hill, CA (US)

(72) Inventors: Jon S Martens, San Jose, CA (US); Karam M Noujeim, Los Altos, CA (US); Thomas H Roberts, Morgan Hill, CA (US); Jamie Tu, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 73 days.

(21) Appl. No.: 13/782,707

(22) Filed: Mar. 1, 2013

(51) Int. Cl.
  *G01R 27/28* (2006.01)
  *G01R 27/32* (2006.01)
  *G01R 35/00* (2006.01)
  *G01R 1/28* (2006.01)
  *G01R 31/28* (2006.01)

(52) U.S. Cl.
  CPC .................................... *G01R 31/28* (2013.01)

(58) Field of Classification Search
  CPC .. H01Q 3/267; H01Q 3/2694; H01L 2924/00; H01L 2924/3011; H01L 2924/00014; H01L 2224/48091; H01L 23/66; G01R 31/28; G01R 35/005; G01R 35/00; G01R 27/28; G01R 27/32; G01R 1/28
  USPC ........................... 324/538–727, 76.39–76.63; 342/368–374
  See application file for complete search history.

(56) References Cited

U.S. PATENT DOCUMENTS

| | | | |
|---|---|---|---|
| 8,059,757 B2 * | 11/2011 | Yanagisawa et al. | 375/319 |
| 2011/0311127 A1 * | 12/2011 | Mizutani et al. | 382/153 |
| 2011/0313711 A1 * | 12/2011 | Behzad et al. | 702/118 |
| 2012/0161784 A1 * | 6/2012 | Benedikt | 324/612 |
| 2012/0195239 A1 * | 8/2012 | Belitzer et al. | 370/281 |

* cited by examiner

*Primary Examiner* — Melissa Koval
*Assistant Examiner* — Felicia Farrow
(74) *Attorney, Agent, or Firm* — Tucker Ellis LLP

(57) ABSTRACT

In an embodiment, a system for measuring high frequency response of a DUT having improved power leveling includes a signal source, a modulator, an upconverter, and a leveling loop having dynamic gain adjustment. The signal source generates a test signal and the modulator modulates the amplitude of the generated test signal to target a requested power. The converter multiplies a frequency of the test signal. The leveling loop is configured to detect an intermediate frequency (IF) signal generated in response to the upconverted test signal. Modulation of the amplitude of the generated test signal by the modulator is adjustable based on the IF signal detected by the leveling loop.

17 Claims, 7 Drawing Sheets

SYSTEMS AND METHODS FOR IMPROVED POWER CONTROL IN MILLIMETER WAVE TRANSCEIVERS

BACKGROUND

1. Technical Field

The present invention relates to test instruments for electrical networks and devices, including network analyzers and other precision transceivers.

2. Background

Historically, many upper millimeter-wave systems have been run with no power control other than that provided by an attenuator and/or saturation of frequency multipliers. The lack of control is often a result of a lack of suitable direct detectors with sufficient dynamic range. The inability to control power prevents power sweeps for device under test compression and other linearity-related measurements, and results in relatively unstable power over time. The control range of the power may also be limited due to stability of the attenuator response.

One approach to controlling power includes leveling the input drive to a millimeter-wave multiplier or multiplier chain. However, because of the relative instability of multipliers themselves (particularly higher order multipliers), the output power at millimeter-wave frequencies can be somewhat unstable. This can cause problems with device modeling measurements where variation in instantaneous power can affect multiple model elements.

Another approach has been to use a post-processed receiver signal to, at a software level, adjust the power setting to return that same processed signal to a nominal value. Because of the many layers of processing, this loop response tends to be very slow and likewise leads to large instantaneous power variations and potential measurement errors of sensitive devices.

What is needed are real-time or near real-time systems and methods for measuring high frequency response of a device under test having improved power leveling.

SUMMARY

Embodiments of the present invention are related to systems and methods for use therewith for measuring high frequency response of electrical networks and devices, collectively referred to herein as devices under test. In accordance with an embodiment, a system for measuring high frequency response of a device under test having improved power leveling includes a signal source, a modulator, an upconverter, and a leveling loop. The signal source generates a test signal based on a requested power and the amplitude of the generated test signal is modulated by the modulator to target the requested power. The upconverter is configured to multiply a frequency of the test signal to millimeter-wave frequencies for measuring an electrical response of the device under test. The leveling loop is configured to detect an intermediate frequency (IF) signal generated in response to the upconverted test signal. The modulation of the amplitude of the generated test signal is adjustable based on a comparison of power of the IF signal detected by the leveling loop with the requested power. The leveling loop includes dynamic gain adjustment to improve response. In an embodiment, the dynamic gain adjustment of the leveling loop includes a nonlinear element allowing loop gain to change with controlled signal amplitude. In an embodiment, the leveling loop includes a downconverter configured to downconvert the upconverted test signal to the IF signal detected by the leveling loop.

In an embodiment, the leveling loop detecting the intermediate frequency is a fine leveling loop, and the system further includes a coarse leveling loop configured to detect the modulated test signal. Modulation of the amplitude of the generated test signal by the modulator is adjustable based on power of the modulated test signal detected by the coarse leveling loop. As with the fine leveling loop, the coarse leveling loop can include dynamic gain adjustment, such as in the form of a nonlinear element allowing loop gain to change with controlled signal amplitude. In an embodiment, the coarse leveling loop is connectable with the modulator to initially level the amplitude of the generated test signal, and the fine leveling loop is connectable with the modulator and the first leveling loop is disconnectable from the modulator to subsequently level the amplitude of the generated test signal. In an alternatively embodiment, the coarse leveling loop is connectable with the modulator in a first mode to level the amplitude of the generated test signal for a frequency-converting device under test, and the fine leveling loop is connectable with the modulator in a second mode to level the amplitude of the generated test signal for a non-frequency-converting device under test.

In an embodiment, the system includes a fine modulator, a coarse modulator, and a coarse leveling loop to detect the modulated test signal. The modulation of the amplitude of the generated test signal by the fine modulator is adjustable based on a comparison of power of the IF signal detected by the leveling loop with the requested power. The modulation of the amplitude of the generated test signal by the coarse modulator is adjustable based on power of the modulated test signal detected by the coarse leveling loop. The signal source is connectable with one or both of the coarse modulator and the fine modulator to modulate the generated test signal.

In accordance with an embodiment, a system for measuring high frequency response of a device under test having improved power leveling includes a transceiver including a signal source, a modulator, an upconverter, and a pair of leveling loops. The signal source is configured to generate a test signal and the modulator is configured to modulate an amplitude of the test signal to target a requested power. The upconverter is configured to multiply a frequency of the test signal. A first signal path extends between the transceiver and the upconverter, and a first leveling loop is connectable with the modulator and configured to detect the modulated test signal as the modulated test signal propagates along the first signal path. When connected to the first leveling loop, the modulator adjusts the amplitude of the generated test signal based on a comparison of power of the modulated test signal detected by the first leveling loop with the requested power. A second signal path extends between the upconverter and a port connectable with the device under test and a second leveling loop connectable with the modulator and configured to detect an intermediate frequency (IF) signal generated in response to the upconverted test signal as the upconverted test signal propagates along the second signal path. When connected to the second leveling loop, the modulator adjusts the amplitude of the generated test signal based on the IF signal detected by the second leveling loop. Both the first leveling loop and the second leveling loop each include dynamic gain adjustment.

In an embodiment, the first leveling loop is connectable with the modulator to initially level the amplitude of the generated test signal, while the second leveling loop is connectable with the modulator and the first leveling loop is disconnectable from the modulator to subsequently level the amplitude of the generated test signal. In an alternative embodiment, the first leveling loop is connectable with the modulator in a first mode to level the amplitude of the generated test signal of a first type of device under test, and the second leveling loop is connectable with the modulator in a second mode to level the amplitude of the generated test signal of a second type of device under test.

In an embodiment, a method of leveling power in a system for measuring high frequency response of a device under test includes generating a test signal using a signal source, and modulating amplitude of the generated test signal based upon measurements of power from signals detected within the system. In an embodiment, amplitude of the generated test signal is targeted based on a requested power. The modulated test signal is upconverted to a millimeter wave frequency using an upconverter such as a frequency multiplier. An intermediate frequency (IF) signal generated in response to the upconverted test signal is detected using a leveling loop and the modulation of the generated test signal is adjusted based on a comparison of power of the IF signal as detected by the leveling loop with the requested power.

In an embodiment, a method of leveling power in a system having a signal source, at least one modulator, and an upconverter for measuring high frequency response of a device under test includes generated a test signal using the signal source and modulating the amplitude of the generated test signal. An amplitude of the generated test signal is targeted based on a requested power. The modulated test signal is detectable using a coarse leveling loop and the modulation of the generated test signal is adjustable based on a comparison of power of the modulated test signal as detected by the coarse leveling loop with the requested power. The modulated test signal is upconverted by an upconverter to millimeter wave frequency for measuring the response of a device under test. An intermediate frequency (IF) signal generated in response to the upconverted test signal is detectable using a fine leveling loop and the adjustment of the modulation of the generated test signal can be refined based on a comparison of power of the IF signal as detected by the fine leveling loop with the requested power.

In an alternative embodiment, a method of leveling power in a system for measuring high frequency response of a device under test depends on a type of device under test that is measured. A test signal is generated using a transceiver, wherein the amplitude of the test signal is modulated using a modulator and targeted based on a requested power. A first leveling loop is connectable to the modulator for a first type of device under test to detect the test signal as it propagates from the modulator to an upconverter. The amplitude of the generated test signal can be adjusted based on a comparison of power of the test signal as detected by the first leveling loop with the requested power. The first type of device under test might include, for example, a network or device for which low frequency test signals are used, or the first type of device under test might include a frequency converting device for which an IF signal is not available. A second leveling loop can be connected to the modulator for a second type of device under test to detect an IF signal generated in response to an upconverted test signal. The amplitude of the generated test signal can be adjusted based on a comparison of power of the IF signal with the requested power. The second type of device under test might include, for example, a non-frequency converting network or device for which IF signals are available.

In an embodiment, a method of calibration a system for measuring high frequency response of a device under test having improved leveling includes correlating a measurement of power of an IF signal generated in response to a test signal based on a known saturation power of an upconverter of the system. Such a method can be usable, for example, with a system that includes a transceiver with a signal source configured to generate a test signal, a modulator configured to modulate an amplitude of the generated test signal, an upconverter configured to multiply a frequency of the generated test signal, and a leveling loop connectable with the modulator and configured to detect an IF signal generated in response to the upconverted test signal. The test signal is generated using the signal source having a power above a known saturation power of the upconverter. The amplitude of the IF signal generated by the device under test is measured upon detection by the leveling loop. The power of the test signal is then swept until the measured IF signal leaves saturation. The measurement of the amplitude of the IF signal is correlated upon leaving saturation to the known saturation power of the upconverter. The power of the test signal is then dropped while measuring the amplitude of the IF signal and the power of the test signal is correlated to the measured amplitude of the IF signal based on linearity of the transceiver to thereby calibrate the system such that a power of a generated test signal substantially matches a power requested by a user.

DETAILED DESCRIPTION

Figure 1:
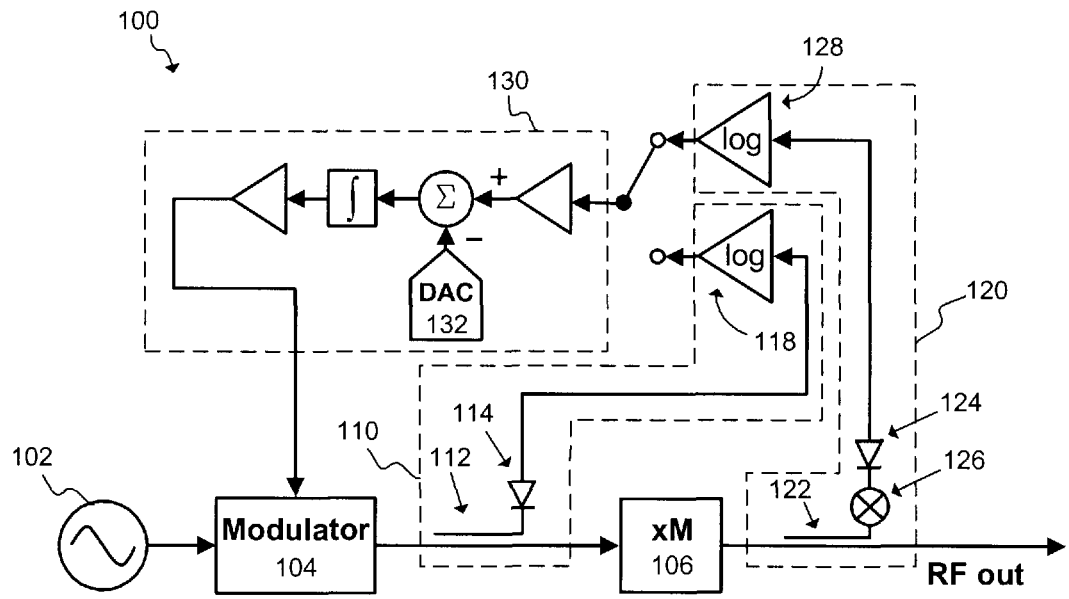
FIG. 1 is a block diagram of an embodiment of a system in accordance with the present invention for measuring high frequency response of a device under test having improved power leveling.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number identifies the drawing in which the reference number first appears.

It would be apparent to one of skill in the art that the present invention, as described below, may be implemented in many different embodiments of hardware, software, firmware, and/or the entities illustrated in the figures. Any actual software, firmware and/or hardware described herein is not limiting of the present invention. Thus, the operation and behavior of the present invention will be described with the understanding that modifications and variations of the embodiments are possible, given the level of detail presented herein.

As device technologies continue to progress in the sub-THz frequency range, the need for accurate power control is desirable for improved device modeling measurements and for systems applications. Traditionally, many measurements and applications in the millimeter frequency range have been performed unleveled or with crude control schemes because of complexities in power detection and the resulting loop dynamic issues. Multiplier saturation has been assumed to keep power constant enough for most measurements. However, wander on the order of a one decibel (dB) or more observed in some systems above 110 GHz may not be adequate for more complete modeling and for certain applications. Further, many applications require power levels below saturation, which tend to be less stable and more difficult to achieve unleveled.

FIG. 1 is a block diagram of an embodiment of a system 100 in accordance with the present invention for measuring high frequency response of a device under test (DUT) having improved power leveling. The DUT (not shown) can include an electrical network, a device, and/or a series of devices, for example that comprise a portion of an electrical network. A test signal is generated by a signal source 102 and the amplitude of the test signal is adjusted by a modulator 104. As used herein, a modulator can refer, for example, to a controllable RF/microwave attenuator. Controllable RF/microwave attenuators can comprise a range of devices each applying different attenuation mechanisms, any of which can be used with embodiments of systems and methods described herein. Typically, a test signal is generated having a frequency in the lower range of the radio frequency (RF) band (e.g. 10 kHz to 100 GHz, although frequency bands of generated test signals can vary widely between systems). Power is detectable at multiple points in the system 100 and compared against a desired setting (i.e. a requested power) in a modulator drive loop 130 connected with the modulator 104. As shown, the modulator drive loop 130 includes a digital-to-analog converter (DAC) 132 providing a requested power signal to a difference node which compares the requested power signal to the detected power and feeds a difference signal to an integrator which then drives the modulator 104.

The power of a high frequency signal delivered to a DUT can be estimated by detecting signals within the system 100 using one or both of two leveling loops 110, 120, each of which is connectable with the modulator 104 through the modulator drive loop 130. The modulated test signal can be coupled to a first leveling loop 110 via a directional coupler 112 as the modulated test signal propagates along a signal path between the modulator 104 and an upconverter 106. The upconverter 106 generates a high frequency test signal (RF out) by upconverting the modulated test signal to a frequency in the millimeter wave range of the RF and infrared bands (e.g. 100-750 GHz). As used herein, an upconverter refers to a device that multiplies the frequency of a signal, although in some embodiments, the upconverter can further translate the frequency of the signal. The upconverter can comprise, for example, a frequency multiplier or frequency multiplier chain. Further, as used herein, upconverting refers to multiplying the frequency of a signal and downconverting refers to dividing the frequency of a signal. The high frequency test signal can be coupled to a second leveling loop 120 as it propagates toward the DUT via a directional coupler 122 arranged along a signal path between the upconverter 106 and a port (not shown) to which the DUT is connected. An intermediate frequency (IF) signal is generated in response to the high frequency test signal by downconverting the high frequency test signal, for example via a mixer 126, so that the power of the IF signal can be compared with the requested power in the modulator drive loop 130. Millimeter wave frequency signals are difficult to process using commonly available technology. However, in embodiments where millimeter wave frequency signals can be processed and used in the modulator control loop 130, the high frequency signal need not be downconverted to an IF signal.

Both the first and second leveling loops 110, 120 include dynamic gain adjustment, for example by way of one or more nonlinear elements 114, 124 that allow loop gain to change with controlled signal amplitude. Due to the exponential-like behavior of many detection systems, the first and second leveling loops 110, 120 can include logarithmic processing to linearize the loop response. It is noted that other details, such as linearizers for other components, are not shown in FIG. 1, although they may be present in embodiments of the system. Further, components such as reference channels and local oscillators (LOs) have been removed to simplify the block diagram. One of ordinary skill in the art will appreciate, upon reflecting on the teachings herein, additional components applicable to embodiments of systems in accordance with the present invention.

Figure 2:
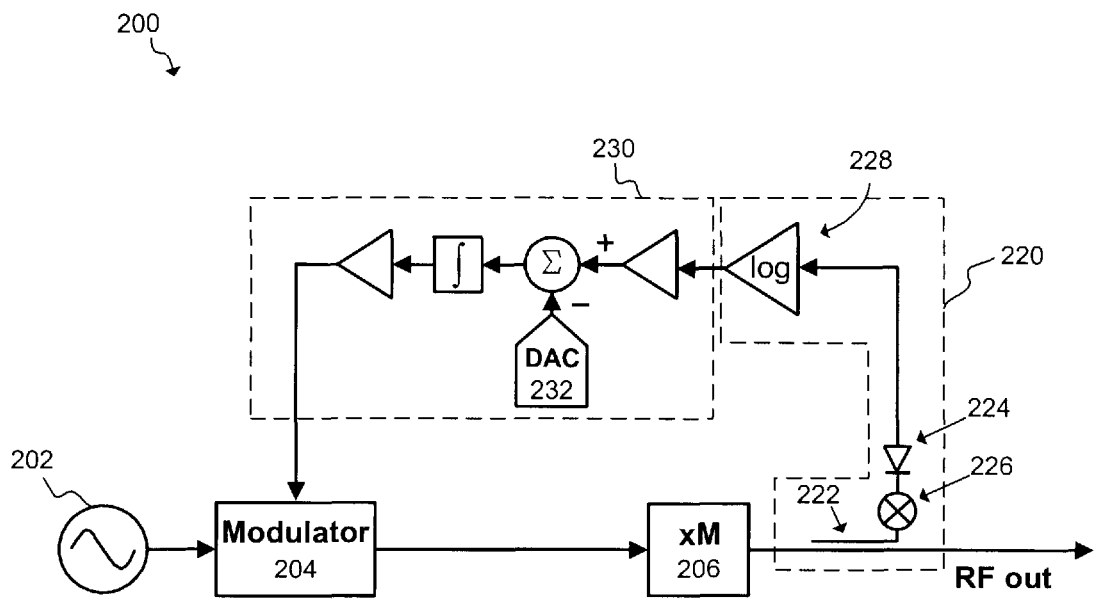
FIG. 2 is a block diagram of an alternative embodiment of a system in accordance with the present invention for measuring high frequency response of a device under test having improved power leveling.

FIG. 2 is a block diagram of an alternative embodiment of a system 200 in accordance with the present invention for measuring high frequency response of a DUT having improved power leveling. The system 200 can comprise a single leveling loop 220 to which is coupled a high frequency signal upconverted from a modulated test signal. The high frequency signal is downconverted to an IF signal using a mixer 226, for example, and compared at a difference node with a requested power signal generated by a DAC 232. The system 200 can be used to measure a non-frequency converting DUT, but is typically not useable with frequency converting DUTs for which an IF signal may not be available. In some embodiments, however, the system can include an LO capable of generating an IF reference when used with a frequency converting DUT, although such an LO may be more complicated in structure and may be more costly than, for example, a system such as shown in FIG. 1.

Figure 3:
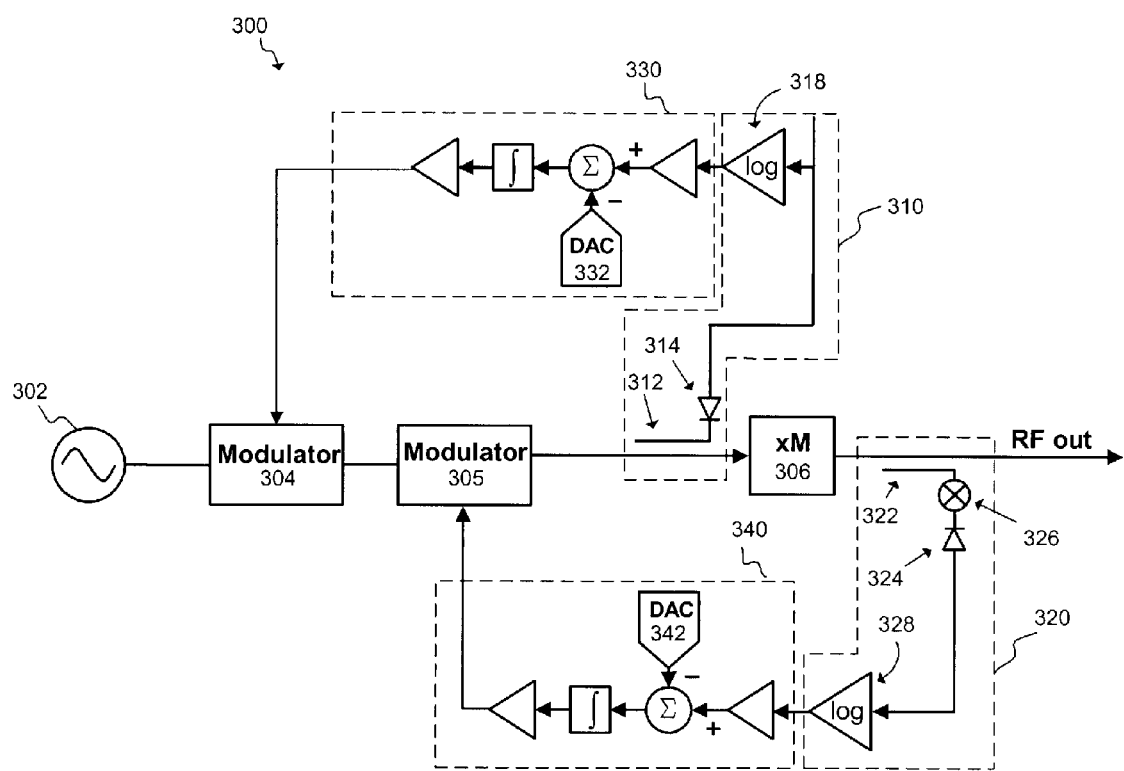
FIG. 3 is a block diagram of a further embodiment of a system in accordance with the present invention for measuring high frequency response of a device under test having improved power leveling.

FIG. 3 is a block diagram of a further embodiment of a system 300 in accordance with the present invention for measuring high frequency response of a DUT having improved power leveling. As with the system 100 of FIG. 1, the system 300 can comprise a pair of leveling loops 310, 320. However, the leveling loops are associated with different modulators 304, 305 to modulate the test signal generated by the signal source 302, with either the control points of the modulators 304, 305 being coordinated or with one of the modulators being in a 'full-on' state. Still further, in some embodiments, the modulator control loop can be a common set of components used by both loops and switched to feed the two dedicated modulators. As will be appreciated upon reflecting on the embodiments provided herein, myriad different combinations of components including dedicated and shared components can be used, and various modifications, additions and alterations may be made to the invention by one skilled in the art without departing from the spirit and scope of the invention as defined in the appended claims.

Figure 4:
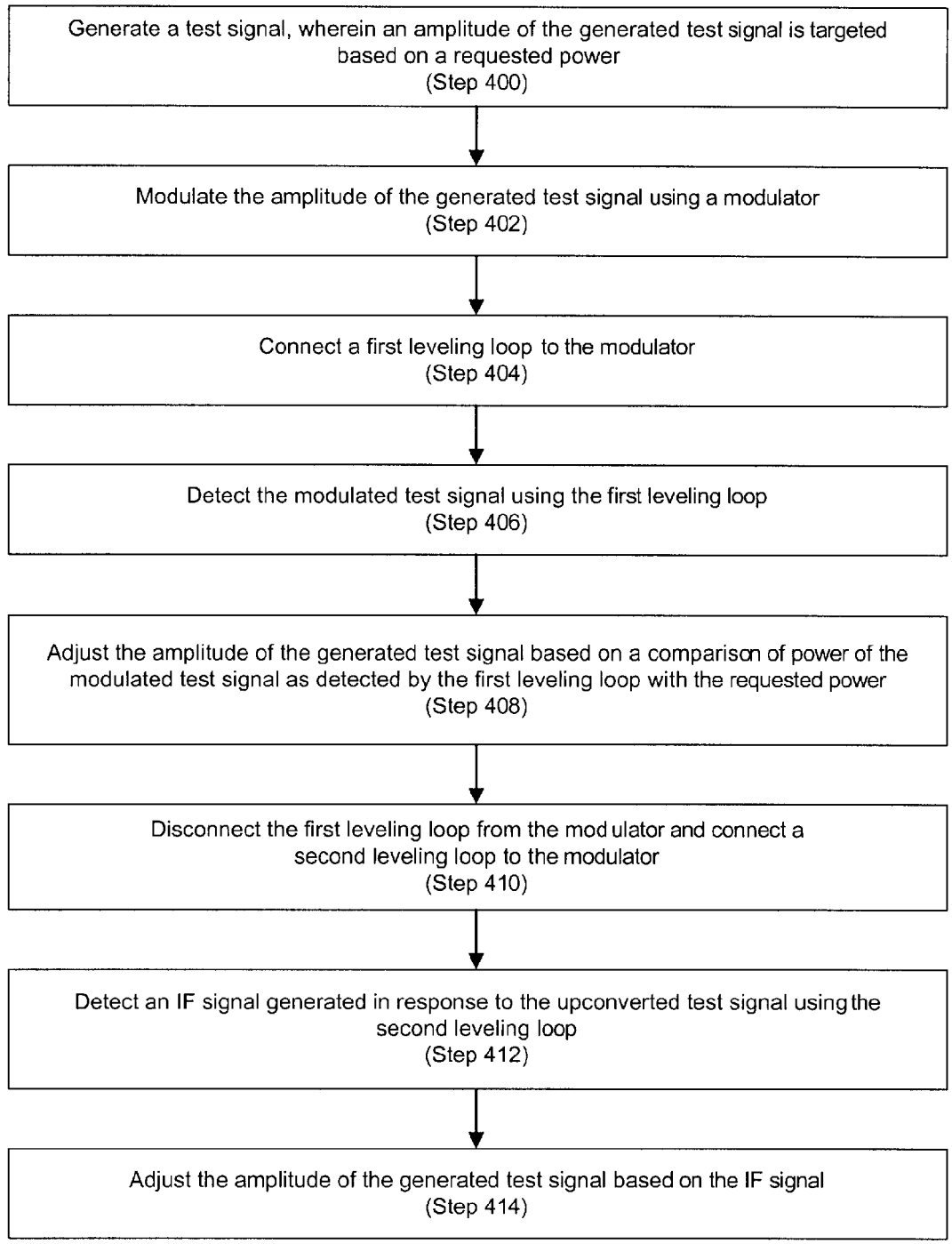
FIG. 4 is a flowchart of an embodiment of a method in accordance with the present invention for leveling power in a system for measuring high frequency response of a device under test.

In some embodiments of methods in accordance with the present invention, multiple leveling loops can be used to coarsely and then finely adjust modulation of a generated test signal. FIG. 4 is a flowchart of an embodiment of a method in accordance with the present invention of leveling power in a system for measuring high frequency response of a DUT. As mentioned above, a DUT can include an electrical network, a device, and/or a series of devices, for example that comprise a portion of an electrical network. The DUT can be connected with a system, such as described above and shown in FIG. 1, at a port of the system. A signal source of the system generates a test signal having an amplitude targeted based on a requested power (Step 400). The amplitude of the generated test signal is adjusted using a modulator (Step 402). A first leveling loop is connected to the modulator through a modulator control loop to initially level the modulated test signal (Step 404). The modulated test signal is detected when the modulated test signal is coupled to the first leveling loop, for example via a directional coupler (Step 406). Modulation of the amplitude of the generated test signal by the modulator is adjusted based on a comparison of the power of the modulated test signal as detected by the first leveling loop with the requested power (Step 408). Leveling can further be refined by connecting a second leveling loop to the modulator control loop, for example by disconnecting the first leveling loop from the modulator control loop and connecting the second leveling loop (Step 410) to the modulator control loop via a switch. The second leveling loop detects an IF signal generated by a downconverter in response to the upconverted, high frequency test signal which is coupled to the leveling loop, for example, via a directional coupler (Step 412). Modulation of the amplitude of the generated test signal by the modulator is further adjusted based on a comparison of the power of the IF signal as detected by the second leveling loop with the requested power (Step 414). In an embodiment, the IF signal is compared at a difference node with the requested power signal generated by a DAC within the modulator control loop. The IF signal can be downconverted, for example, by mixing the signal via a mixer. In embodiments, the first leveling loop and the second leveling loop include dynamic gain adjustment, and detected signals are linearized before being processed in the modulator control loop.

In some embodiments of methods in accordance with the present invention, multiple leveling loops can be used to level different types or classes of DUTs. For example, for non-frequency converting devices, such as amplifiers, filters, transmission lines, etc., a leveling loop detecting the upconverted, high-frequency test signal can be relied upon for leveling due to the availability of IF signals, or both the low frequency (i.e. first) leveling loop and the high frequency (i.e. second) leveling loop can be relied upon for coarse and fine leveling, respectively. For frequency converting devices, a leveling loop detecting the modulated test signal can be relied upon for leveling, due to the general unavailability of IF signals (although, as mentioned above, in some embodiments IF signals can be made available even when measuring frequency-converting devices).

Figure 5:
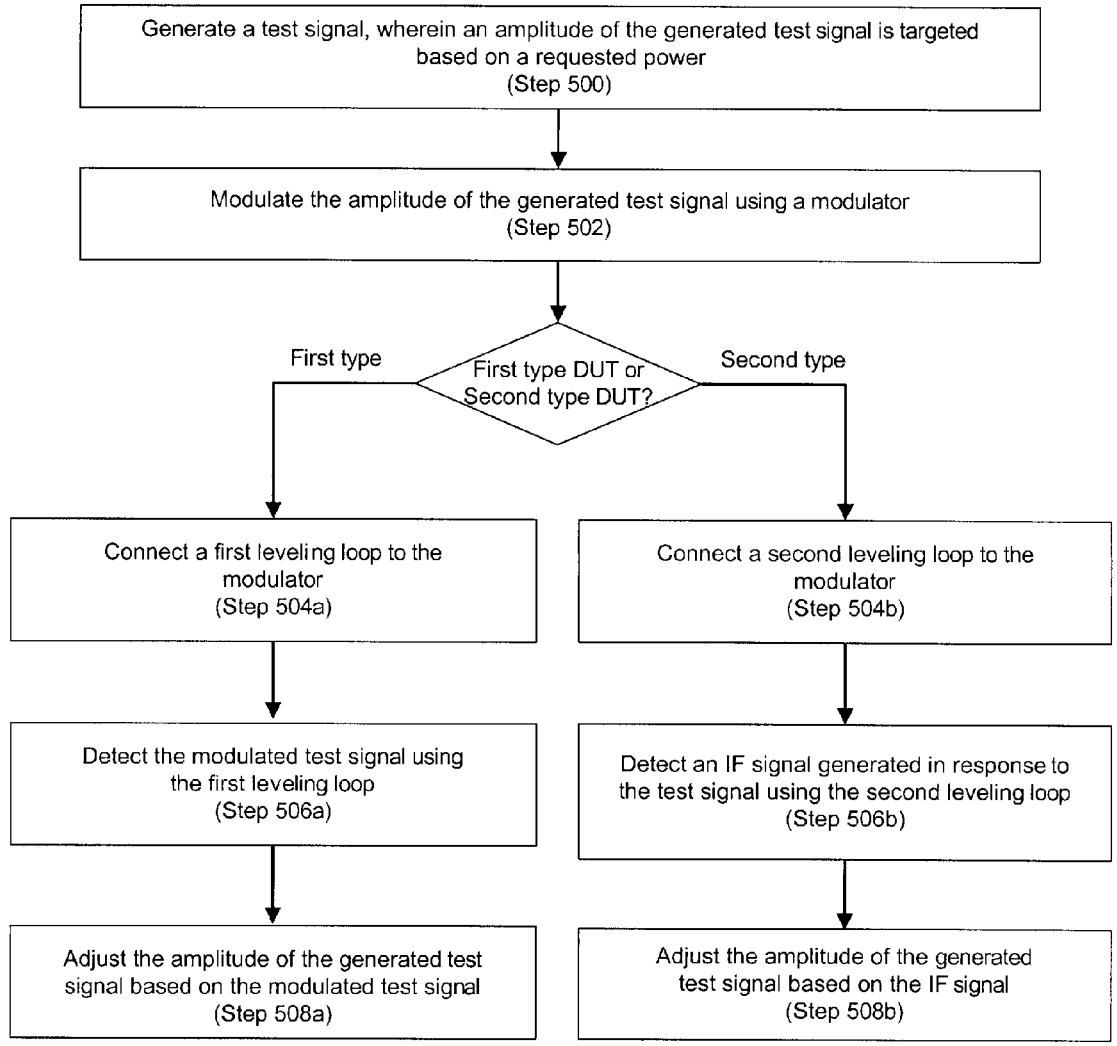
FIG. 5 is a flowchart of an alternative embodiment of a method in accordance with the present invention for leveling power in a system for measuring high frequency response of a device under test.

FIG. 5 is a flowchart of an embodiment of a method in accordance with the present invention of leveling power in a system for measuring high frequency response of different types or classes of DUTs. The DUT can be connected with a system, such as described above, at a port of the system. A signal source of the system generates a test signal having an amplitude targeted based on a requested power (Step 500). The amplitude of the generated test signal is adjusted using a modulator (Step 502). For a first type or class of DUT, a first leveling loop is connected to the modulator through a modulator control loop to level the modulated test signal (Step 504a). The modulated test signal is detected when the modulated test signal is coupled to the first leveling loop, for example via a directional coupler (Step 506a). Modulation of the amplitude of the generated test signal by the modulator is adjusted based on a comparison of the power of the modulated test signal as detected by the first leveling loop with the requested power (Step 508a). The first type or class of DUT can include, for example, frequency converting DUTs for which an IF signal is not typically available. For a second type or class of DUT, a second leveling loop is connected to the modulator through a modulator control loop to level the modulated test signal (Step 504b). The second leveling loop detects an IF signal generated by a downconverter in response to the upconverted, high frequency test signal which is coupled to the leveling loop, for example, via a directional coupler (Step 506b). Modulation of the amplitude of the generated test signal by the modulator is further adjusted based on a comparison of the power of the IF signal as detected by the second leveling loop with the requested power (Step 508b). In an embodiment, the upconverted, high frequency signal is downconverted for comparison with the requested power signal generated by a DAC within the modulator control loop. The high frequency signal can be downconverted, for example, by mixing the signal via a mixer. In embodiments, the first leveling loop and the second leveling loop include dynamic gain adjustment, and detected signals are linearized before being processed in the modulator control loop.

Figure 6:
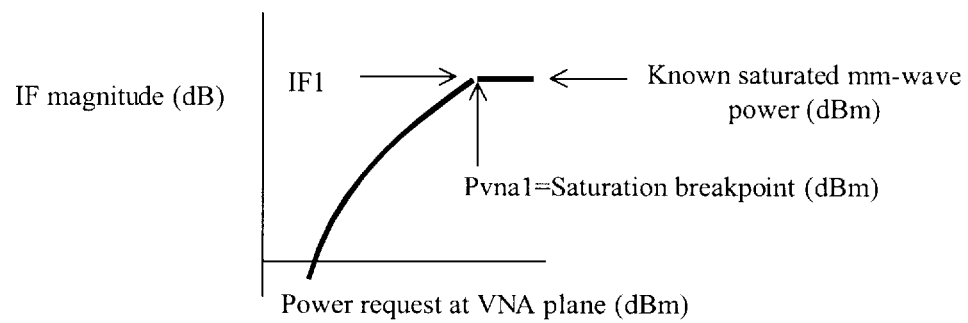
FIG. 6 illustrates IF response as a function of power requested in an embodiment of a system in accordance with the present invention.

Embodiments of systems in accordance with the present invention are preferably calibrated so that power settings correspond as closely as possible or practicable to actual power levels delivered. Taking the embodiment of the system of FIG. 1 as an example, the modulated test signal detected by the first leveling loop of the system is used with standard automatic level control (ALC) calibrations so that the power settings correspond roughly to the actual levels delivered. However, the system likely has no knowledge of the relationship between millimeter wave power levels and the power settings, because the upconverted signal is not directly detected by the system. Embodiments of methods in accordance with the present invention can rely on indirect measurements and the linearity of the system. Referring to FIG. 6, the system will have a known millimeter wave saturation power that can be correlated to the amplitude of an IF signal detected by the second leveling loop. The saturation power is generally known from manufacturer measurements that are often based on quasi-optical or other techniques. As shown, the magnitude of the IF signal levels off as the system reaches saturation. A power can be requested that places the upconverter of the system in saturation. The power can then be locally swept until the amplitude of the measured IF signal leaves saturation, indicating the saturation breakpoint. The IF reading can be noted at this point and linked to the known millimeter wave saturated power. The power can be dropped and the IF magnitude recorded as a function of this setting. Based on the absolute linearity and/or knowledge of linearity of the system together with information about the saturated power, the IF changes can be linked to the power level.

Figure 7:
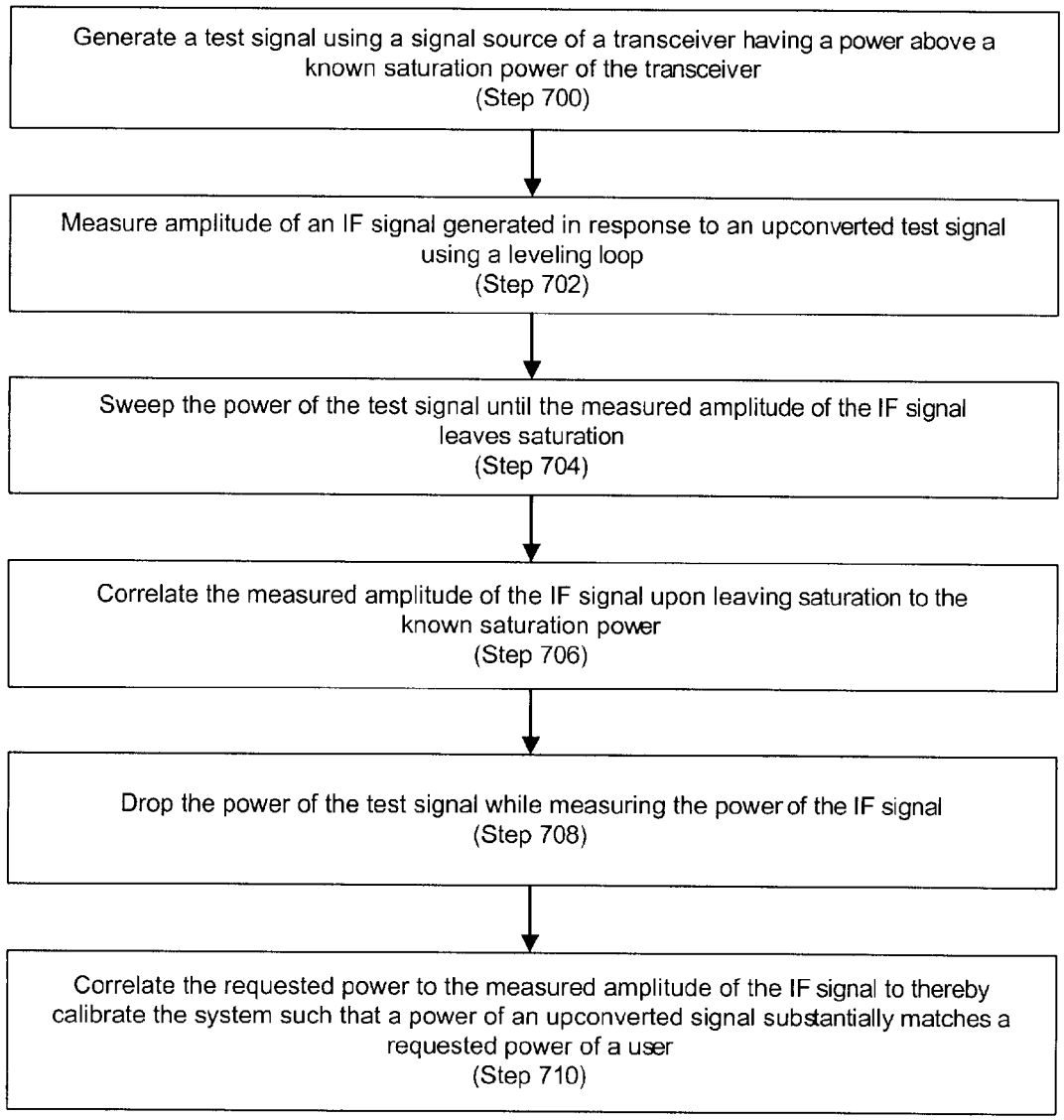
FIG. 7 is a flow chart of an embodiment of a method in accordance with the present invention for calibrating a system for measuring high frequency response of a device under test having improved leveling.

FIG. 7 is a flowchart illustrating an embodiment of a method in accordance with the present invention for calibrating a system for measuring high frequency response of a device under test having improved leveling, such as shown for example in FIG. 1. A test signal having a power above a known millimeter-wave saturation power is generated using a signal source of the system (Step 700). An IF signal is generated in response to detection of an upconverted high frequency signal using a leveling loop and the amplitude of the IF signal is measured (Step 702). The power of the generated test signal is then swept until the measured amplitude of the IF signal leaves saturation (Step 704), upon which time the measured amplitude can be correlated to the known saturation power (Step 706). The power of the test signal can then be dropped while measuring the amplitude of the IF signal (Step 708) and the requested power can be correlated to the measured amplitude of the IF signal to thereby calibrate the system such that a power of an upconverted signal substantially matches a requested power of a user (Step 710).

Figure 8:
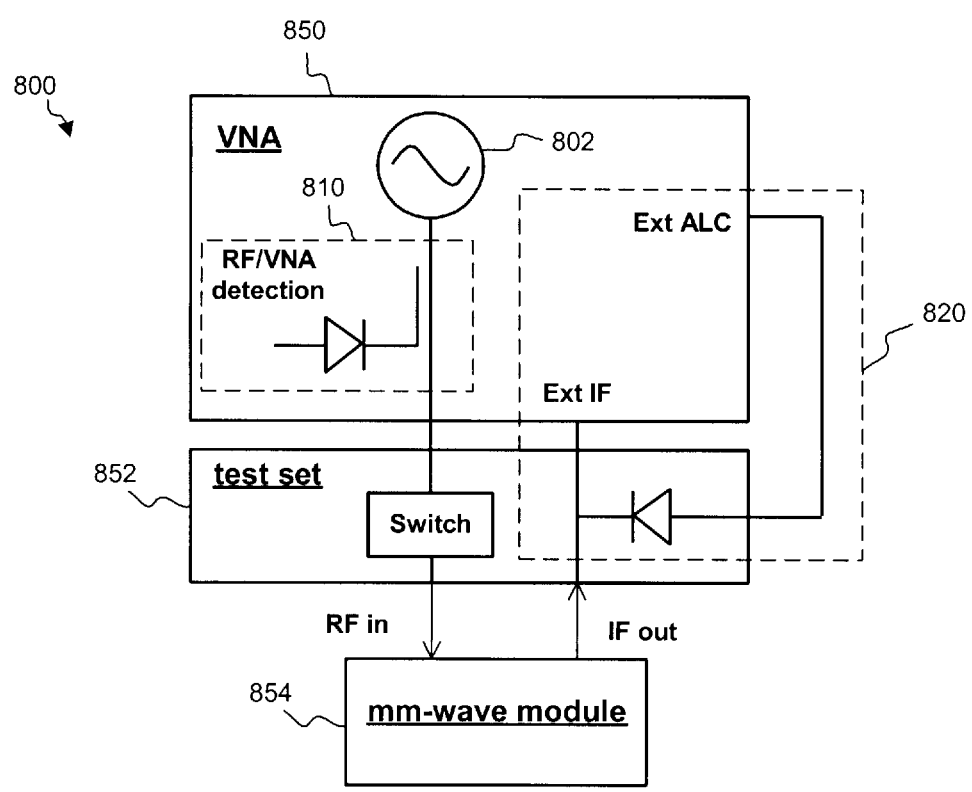
FIG. 8 is an embodiment of a test instrument in accordance with the present invention comprising the system of FIG. 1.

Embodiments of measurement instruments in accordance with the present invention can comprise a system physically integrated or physically separated into multiple different components. An embodiment of a measurement instrument 800 in accordance with the present invention is illustrated in the block diagram of FIG. 8. The measurement instrument 800 is physically separated into three components 850, 852, and 854 that can be connected together to form a circuit as shown in FIG. 1. A vector network analyzer 850 includes the signal source, an RF/VNA detection loop 810 including dynamic gain adjustment, and a portion of an IF detection loop 820. A test set 852 takes the signal source output and routes it to the DUT, routes the signal to be measured to the receivers, and splits off a reference channel for the incident wave. The incident wave is detected and provided to the IF detection loop 820. A mm-wave module 854 upconverts the signal source output to millimeter wave frequencies and can include a local oscillator (LO) for providing a reference signal to the reference channel. In still further embodiments, the components can be partially integrated, fully integrated, or subdivided. One of ordinary skill in the arts, upon reflecting on the teachings herein will appreciate the different ways in which separately housed and/or disconnectable components can be arranged.

In some embodiments, the present invention includes a computer program product which is a storage medium or computer readable medium (media) having instructions stored thereon/in which can be used to program a computer to perform any of the processes of the present invention. For example, methods described herein can be partially or wholly embodied as instructions for execution by systems. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing description of the present invention has been presented for purposes of illustration and description. It is not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A system for measuring high frequency response of a device under test having improved power leveling, comprising: a signal source configured to generate a test signal comprising a radio frequency (RF) signal; and a fine modulator configured to modulate an amplitude of the generated test signal, wherein the amplitude of the test signal is targeted based on a requested power; an upconverter configured to multiply a frequency of the test signal; a fine leveling loop configured to detect an intermediate frequency (IF) signal generated in response to the upconverter test signal, wherein modulation of the amplitude of the generated test signal by the modulator is adjustable based on the IF signal detected by the leveling loop; and wherein the leveling loop includes dynamic gain adjustment; and a coarse modulator; and a coarse leveling loop configured to detect the modulated test signal propagating between the modulator and the upconverter, wherein the modulation of the amplitude of the generated test signal by the coarse modulator is adjustable based on power of the modulated test signal detected by the coarse leveling loop; wherein the signal source is connectable with one or both of the coarse modulator and the fine modulator to modulate the generated test signal.

2. The system of claim 1, wherein the dynamic gain adjustment includes a nonlinear element allowing loop gain to change with controlled signal amplitude.

3. The system of claim 1, wherein the leveling loop includes a downconverter configured to downconvert the upconverted test signal to the IF signal detected by the fine leveling loop.

4. A system for measuring high frequency response of a device under test having improved power leveling, comprising:
   a signal source configured to generate a test signal comprising a radio frequency (RF) signal; and
   a modulator configured to modulate an amplitude of the generated test signal,
   wherein the amplitude of the test signal is targeted based on a requested power;
   an upconverter configured to multiply a frequency of the test signal;
   a fine leveling loop configured to detect an intermediate frequency (IF) signal generated in response to the upconverted test signal, wherein modulation of the amplitude of the generated test signal by the modulator is adjustable based on the IF signal detected by the fine leveling loop; and
   wherein the fine leveling loop includes dynamic gain adjustment; and
   a coarse leveling loop configured to detect the modulated test signal propagating between the modulator and the upconverter, wherein modulation of the amplitude of the generated test signal by the modulator is adjustable based on power of the modulated test signal detected by the coarse leveling loop; and
   wherein the coarse leveling loop includes dynamic gain adjustment.

5. The system of claim 4, wherein the coarse leveling loop is connectable with the modulator to initially level the amplitude of the generated test signal, and wherein the fine leveling loop is connectable with the modulator and the coarse leveling loop is disconnectable from the modulator to subsequently level the amplitude of the generated test signal.

6. The system of claim 4, wherein the coarse leveling loop is connectable with the modulator in a first mode to level the amplitude of the generated test signal for a frequency-converting device under test, and the fine leveling loop is connectable with the modulator in a second mode to level the amplitude of the generated test signal for a non-frequency-converting device under test.

7. A system for measuring high frequency response of a device under test having improved power leveling, comprising:
- a transceiver including a signal source configured to generate a test signal comprising a radio frequency (RF) signal;
- a modulator configured to modulate an amplitude of the test signal, wherein the amplitude of the test signal is targeted based on a requested power;
- an upconverter configured to multiply a frequency of the test signal;
- a first signal path between the transceiver and the upconverter;
- a second signal path between the upconverter and a port connectable with the device under test;
- a first leveling loop connectable with the modulator and configured to detect the modulated test signal as the modulated test signal propagates along the first signal path, wherein when connected to the first leveling loop, the modulator adjusts the amplitude of the generated test signal based on a comparison of power of the modulated test signal detected by the first leveling loop with the requested power; and
- a second leveling loop connectable with the modulator and configured to detect an intermediate frequency (IF) signal generated in response to the upconverted test signal as the upconverted test signal propagates along the second signal path, wherein when connected to the second leveling loop, the modulator adjusts the amplitude of the generated test signal based on the IF signal detected by the second leveling loop;
- wherein the first leveling loop and the second leveling loop each include dynamic gain adjustment.

8. The system of claim 7, wherein the first leveling loop is connectable with the modulator to initially adjust the modulation of the generated test signal, and wherein the first leveling loop is disconnectable from the modulator and the second leveling loop is connectable with the modulator to subsequently adjust the modulation of the generated test signal.

9. The system of claim 7, wherein the first leveling loop is connectable with the modulator in a first mode to adjust the modulation of the generated test signal for a frequency converting device under test, and the second leveling loop is connectable with the modulator in a second mode to adjust the modulation of the generated test signal for a non-frequency converting device under test.

10. The system of claim 7, wherein the second leveling loop includes a downconverter configured to downconvert the upconverted test signal so that modulation of the amplitude of the generated test signal is adjustable based on a comparison of power of the downconverted signal with the requested power.

11. The system of claim 7, wherein the first leveling loop detects the modulated test signal by coupling the modulated test signal to the first leveling loop along the first signal path; and wherein the second leveling loop detects the IF signal by coupling the upconverted test signal to the second leveling loop along the second signal path.

12. The system of claim 7, wherein the dynamic gain adjustment of the first leveling loop and the second leveling loop includes a nonlinear element allowing loop gain to change with controlled signal amplitude.

13. The system of claim 7, wherein the upconverter includes at least one multiplier.

14. A method of leveling power in a system having a signal source, at least one modulator, and an upconverter for measuring high frequency response of a device under test, comprising:
- generating a test signal comprising a radio frequency (RF) signal using the signal source, wherein an amplitude of the generated test signal is targeted based on a requested power;
- modulating the amplitude of the generated test signal;
- detecting the modulated test signal using a coarse leveling loop;
- adjusting the modulation of the generated test signal based on a comparison of power of the modulated test signal as detected by the coarse leveling loop with the requested power;
- upconverting the modulated test signal using an upconverter;
- detecting an intermediate frequency (IF) signal generated in response to the upconverted test signal using a fine leveling loop; and
- refining the adjustment of the modulation of the generated test signal based on a comparison of power of the IF signal as detected by the fine leveling loop with the requested power.

15. The method of claim 14, further comprising:
- connecting the coarse leveling loop to a coarse modulator;
- coupling the modulated test signal to the coarse leveling loop;
- adjusting the modulation of the generated test signal by the coarse modulator based on a comparison of power of the modulated test signal as detected by the coarse leveling loop with the requested power;
- connecting the fine leveling loop to a fine modulator;
- coupling the upconverted test signal to the fine leveling loop; and
- downconverting the upconverted test signal to the IF signal using a downconverter;
- adjusting the modulation of the generated test signal by the fine modulator based on a comparison of power of the IF signal as detected by the fine leveling loop with the requested power.

16. A method of leveling power in a system for measuring high frequency response of a device under test, comprising:
- generating a test signal using a transceiver, wherein an amplitude of the generated test signal is targeted based on a requested power;
- modulating the amplitude of the generated test signal using a modulator;
- upconverting the modulated test signal to a millimeter wave frequency using an upconverter;
- for a first type of device under test
  - connecting a first leveling loop to the modulator,
  - detecting the modulated test signal using the first leveling loop, and
  - adjusting the amplitude of the generated test signal based on a comparison of power of the modulated test signal as detected by the first leveling loop with the requested power; and
- for a second type of device under test
  - connecting a second leveling loop to the modulator,
  - detecting an intermediate frequency (IF) signal generated in response to the upconverted test signal using the second leveling loop, and
  - adjusting the amplitude of the generated test signal based on the IF signal.

17. The method of claim 16, wherein the first type of device under test is a frequency converting device under test and the second type of device under test is a non-frequency converting device under test.

* * * * *